United States Patent [19]

Collins et al.

[11] Patent Number: 4,509,451
[45] Date of Patent: Apr. 9, 1985

[54] ELECTRON BEAM INDUCED CHEMICAL VAPOR DEPOSITION

[75] Inventors: George J. Collins; Lance R. Thompson; Jorge J. Rocca; Paul K. Boyer, all of Ft. Collins, Colo.

[73] Assignee: Colromm, Inc., Fort Collins, Colo.

[21] Appl. No.: 479,987

[22] Filed: Mar. 29, 1983

[51] Int. Cl.³ .................. C23C 13/08; B05D 3/06
[52] U.S. Cl. ................... 118/50.1; 118/620; 118/723; 427/39; 427/42; 204/164
[58] Field of Search ............ 427/38, 39, 42; 118/50.1, 620, 723; 204/164; 422/186.04, 186.21, 186.22, 186.3; 313/346R

[56] References Cited

U.S. PATENT DOCUMENTS

| | | | |
|---|---|---|---|
| 3,472,679 | 10/1969 | Ing et al. | 427/38 |
| 3,704,216 | 11/1972 | Kinstley et al. | 204/164 |
| 3,843,902 | 10/1974 | Miram et al. | 313/346 R |
| 4,336,277 | 6/1982 | Bunshah et al. | 427/38 |

*Primary Examiner*—John E. Kittle
*Assistant Examiner*—James J. Seidleck

[57] ABSTRACT

Applicants have invented a new low temperature method (50° C. to 500° C.) to deposit and grow microelectronic thin films using cold cathode electron beams to initiate and sustain both gas phase and surface chemical reactions. The new method uses electron beams generated by glow discharge electron guns. Secondary electrons are emitted from these electron guns following ion and fast neutral bombardment upon cathode surfaces and secondary electrons so formed are accelerated in the cathode sheath.

Our method uses the plasma generated electron beams to decompose reactant molecules directly by electron impact and indirectly by the vacuum ultraviolet radiation generated following rare gas electron collisions in the beam region. The reactant molecules can be in the gas phase or adsorbed on substrate surfaces. The electron beams are spatially confined and excite only a localized region above the substrate so that direct plasma bombardment of the substrate is avoided. The film growth and deposition reactions take place on a heated (50° C.–500° C.) substrate therefore with reduced radiation damage at high deposition and growth rates required for in line single wafer processing (>1000Å/min). Microelectronic films such as insulators, conductors and semiconductors can be deposited and native films such as oxides and nitrides can be grown with the use of electron beam assisted decomposition of gas molecule reactants.

25 Claims, 4 Drawing Figures

ELECTRON BEAM INDUCED CHEMICAL VAPOR DEPOSITION

PRIOR ART

The microelectronics industry uses silicon substrates for most integrated circuits due to the excellent properties associated with its native oxide, silicon dioxide. Industrial thermal processes attain $SiO_2$ by exposing silicon wafers in a 1000° C. steam atmosphere for a period of up to twelve hours.

The high temperatures (>500° C.) used in conventional thermal growth processes induce device dimension limiting effects such as dopant redistribution, wafer warpage, as well as crystalline defect generation and propagation. Thermal growth cannot be done for III-V materials or HgCdTe without damage to the substrate due to thermal decomposition. Temperatures below 350° are required for III-V semiconductor processing. Moreover, the native oxides have poor electrical characteristics.

Recently, low temperature techniques have been introduced which deposit films such as silicon dioxide, $SiO_2$ or silicon nitride, $Si_3N_4$ by means of dissociating film donor gas molecules. These new processes include various forms of chemical vapor deposition (CVD). Examples of CVD include plasma enhanced CVD and photo-assisted CVD. Each of these low temperature techniques requires substrate temperatures of approximately 50° C. to 500° C. for high quality film deposition.

Problems are also associated with each of the low temperature CVD techniques to deposit films. In a radio frequency plasma enhanced CVD system, process parameters such as rf power, rf frequency, electrode spacing and gas flows are so interrelated it is difficult to characterize or control effects due to one parameter. Also the reaction volume fills the chamber and reactants are lost to the walls. Impurities are also sputtered from the walls due to plasma potential. Finally, radiation damage to devices and interface layers occurs in plasma enhanced CVD because substrates are in direct contact with the plasma.

Photo-assisted CVD allows for localized reaction volumes minimizing radiation damage, wall sputtering and wall losses of reactants. Laser or lamp power used in photo-assisted CVD is independent of film conditions such as gas flows and chamber pressure. But laser or lamp produced photons may not completely decompose the reactant gases because the photon wavelength is too long. Also the laser is often energy inefficient and an expensive tool of low reliability, hence unsuitable for a production environment.

BACKGROUND OF INVENTION

The need for low temperature (50°-500° C.) silicon semiconductor processes becomes increasingly important as semiconductor device structures move to submicron dimensions. The electron beam CVD method claimed within has the advantage of being a low temperature process that is confined in space, like laser CVD, thereby minimizing substrate radiation damage. The plasma potential does not exist on reactor walls not in contact with the confined electron beam plasma. Hence, wall sputtering is minimized. Also the electron beam source parameters can be more independently controlled allowing one to create more uniform plasmas and produce more complete cracking patterns that conventional radio frequency generated plasmas used for film deposition. Hence, more repeatable and uniform film depositions can occur at higher deposition rates. The electron beam plasma can also generate vacuum ultraviolet (VUV) photons from rare gas atoms and act as an in-situ VUV lamp. The VUV radiation so produced adds an additional mechanism by which electron beam generated plasmas can deposit microelectronic thin films and enhance native film growths. Finally the electron beam source is less expensive and more efficient than a laser.

BRIEF DESCRIPTION

Applicants have invented a new low temperature method to deposit and grow microelectronic thin films. The method uses d.c. electron beams to dissociate gas molecules into constituent atoms either directly by electron impact or indirectly by vacuum ultraviolet photons or finally via subsequent rare gas sensitized reactions

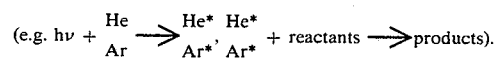

The film donor atoms so formed diffuse to a substrate surface and react to form a solid thin film. Alternatively, or in tandem, dissociation of donor molecules on the substrate surface can occur again either via electron impact or photoabsorption and film growth occurs.

Electron beams used to dissociate and activate the reactant gases are produced by a glow discharge, cold cathode electron gun, operating at pressures between 0.01 and 5 Torr in a mixture of a rare gas (e.g. He, Ar) and other reactant gases without the need of differential pumping. A high negative potential (0.5-10 kV) applied to the cathode, drops mainly across the dark space or cathode sheath region. Ions and fast neutrals from the bulk of the plasma accelerate through the dark space towards the cathode and bombard the cathode surface. Thus, electrons are emitted from the cathode, which is made of a high electron emission coefficient material. The electrons are accelerated through the dark space away from the cathode by the high electric field existing in that region.

The resulting electron beam can be used to directly dissociate reactant molecules by impact and thus film deposition occurs. Alternatively, the electron beam is used to excite rare gases to cause the emission of deep VUV radiation. Film deposition then occurs by rare gas sensitized reactions or by photon dissociation or by both. Separate location of the rare gas and reactant gas inlets with respect to the electron gun and substrate locations enhances the electron beam or photon dissociation respectively. Because of the high energy and low pressure the electron mean free path is long compared to typical wafer dimensions (e.g. 10 cm). Hence uniform deposition conditions occur. Either electron or photon dissociation of gas phase reactants is selected by the location of the electron gun, substrate and gas flows as described herein.

High energy electrons emitted from the glow discharge electron gun collide directly with the reactant gas molecules thereby dissociating these reactant species and creating free radicals including excited atoms and positive and negative ions. Alternatively the vacuum ultraviolet rare gas photons and rare gas sensitized reactions can cause reactant dissociation via photoabsorption and sensitized gas collisions respectively. Secondary electrons are emitted in the ionizing collisions of beam electrons with atoms and molecules. Many of these secondary electrons also have enough energy to excite, ionize and dissociate the reactant molecules. The excited and radical species diffuse across a boundary layer to a heated substrate. Nucleation occurs at adsorption sites leading to the formation of islands. The reactions continue with coalescence of the islands and finally a uniform film is created. VUV photons and sensitized collisions occurring at the surface will aid these reactions.

Examples of possible types of film deposition with the new electron beam technique include: semiconductors, such as: (doped and undoped) amorphous, polycrystalline or epitaxial silicon; III-V materials such as gallium arsenide or InGaAs; zinc oxide; insulators such as silicon dioxide, aluminum nitride or silicon nitride; and metallic conductors such as tungsten, aluminum Al-Si-Cu or metallic silicides. An additional application of this approach is an enhanced low temperature growth of native films of various materials. Then an elemental compound within the substrate or a film on the substrate is used as a reactant in the formation of the desired compounds. An example of a native film growth is silicon dioxide ($SiO_2$) on bare silicon wafers by the electron beam creation of excited molecular and atomic oxygen species which diffuse into and oxidize the silicon in the substrate. The existence of UV and VUV radiation increases the film growth rate of $SiO_2$. Finally, low temperature nitridation of $SiO_2$ films, such as gate oxides, occurs by creation of excited nitrogen species to form a thin silicon nitride or oxynitride layer over the $SiO_2$.

Each film's donor atoms are contained in the vapor phase by use of a specific reactant gas in the case of deposition reactions. Specific examples of gas molecules used in the deposition of films include silane as a silicon donor, nitrous oxide as an oxygen donor, ammonia as a nitrogen donor and $TaCl_5$ as a tantalum donor and trimethal aluminum as an aluminum donor and the hexaflorides and carbonyls of refractory metals.

Referring to the herewith drawings, which form a part of this application,

DETAILED DESCRIPTION

Figure 1:
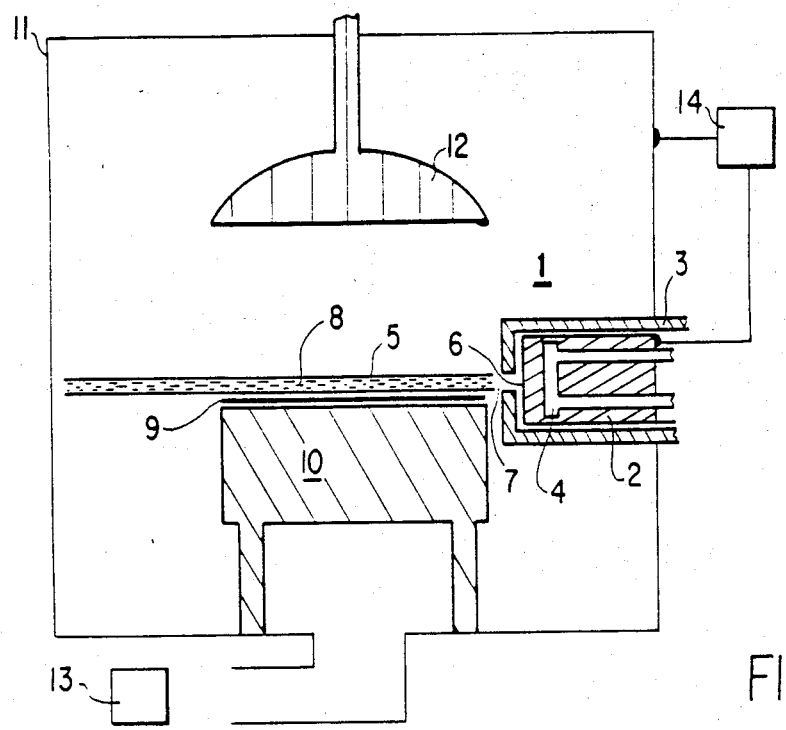
FIG. 1 is a diagrammatic sketch illustrative of the first embodiment of our invention incorporating a single electron beam source.

The first embodiment of our invention, shown in FIG. 1, is explained as follows. A planar sheet of electrons is generated by an electron gun [1] composed of a cold cathode body [2], a water inlet/outlet and waterpool cooling system [4], and a shield [3], which confines cathode emission of electrons from gun [1] to form an electron beam of the desired confined geometry. Ions are allowed to bombard the cathode only through an opening of rectangular shape in the shields placed within the dark space of the cathode. The electrons are emitted from the unshielded cathode surface [6] and accelerate through the cathode dark space [7] to form an electron beam of rectangular shape. Thus, the so produced collimated sheet of electrons [5] collides with the reactant gas molecules in the volume [8] at a controlled distance from the substrate. The excitation volume is localized to reduce radiation damage to the substrate [9].

The electron impact reactions or vacuum ultraviolet absorptions occur in a localized region near or on the heated substrate [9] depending on reactor geometry. The substrate heater [10] can be of any type suitable for semiconductor deposition processes. The substrate heater and the cold cathode gun are included in a gas vessel [11]. The gas vessel is provided with separate gas feeding inlets for rare gases [12] and reactants [12A]. A vacuum pump [13] is required to maintain gas flow. Initially the pump evacuates air out of the vessel [11] and then continuously flows reactant gases [8] through the vessel [11] keeping at the same time the most suitable compromise pressure (between 0.1 and 5 Torr) for both the plasma electron beam generation and for the properties of the deposited or grown films.

A d.c. power supply [14] of up to 10 kV provides the potential to establish the glow discharge electron beam [5]. The electron gun could also be operated on a pulse basis, using a different power supply and a pulsed gas flow.

Figure 2:
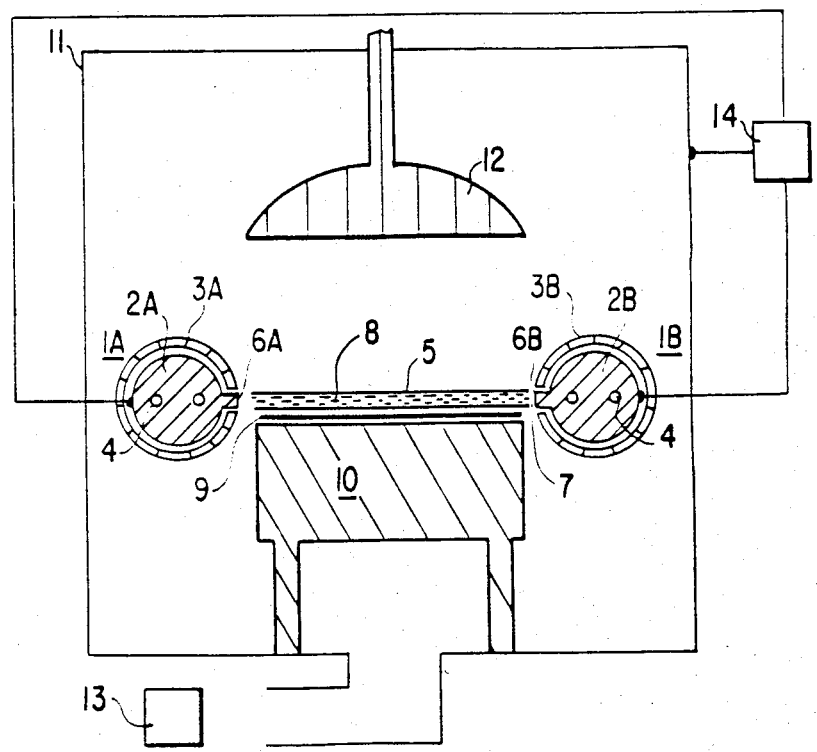
FIG. 2 is a diagrammatic sketch illustrative of the second embodiment of our invention which incorporates multiple pairs of electron beam sources.

The second embodiment of the invention is shown in FIG. 2 and includes the use of one or more pairs of opposing electron guns [1A,1B]. Each electron gun is comprised of a cathode body [2A,2B] and shield [3A,3B]. Each cathode shield [3A,3B] confines the electron emission to the front of cathode surfaces [6A,6B]. Each unshielded cathode surface is rectangular in shape in order to emit electrons in a planar sheet [5]. Each cathode is water cooled from behind by a water inlet/outlet waterpool system [4]. The cathodes in this embodiment are placed with opposing surfaces in order to increase the amount of electrons entering the reaction volume [8] in a planar manner, and at the same time to increase the uniformity of the plasma. This is accomplished by partial electrostatic trapping of electrons confined between cathodes. Thus, uniform films may be deposited across silicon wafers substrates [9] up to 6" (15 cm) in diameter.

The planar sheet of electrons in this embodiment travel parallel to a heated substrate [9] as in the first embodiment. The use of the two opposing cathodes consequently increases both the uniformity and the rate of the film deposition. This allows for larger substrate sizes and shorter process times. This is crucial to in-line single wafer processings.

As in the first embodiment the electron gun pairs [1A,1B] and the substrate heater [10] of the second embodiment are included in a gas vessel [11] suitably fitted with the gas inlets [12] and a vacuum pump [13] as described in the first embodiment. Location of the electron beam sheet [5] near the substrate [9] and through the reactant gas volume [8] results in direct electron impact dissociation of reactants to the wafer while remote location of the electron beam from the substrate [9] and reactant gas volume [8] results in VUV and sensitized dissociation.

Figure 3:
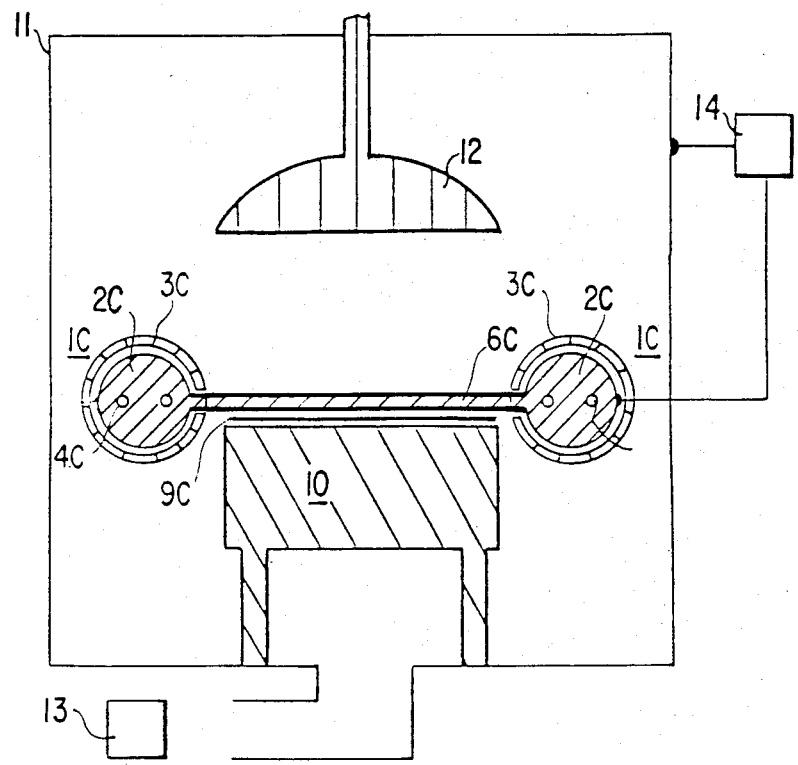
FIG. 3 is a diagrammatic sketch illustrative of the third embodiment of our invention which incorporates a ring electron beam source.

The third embodiment of the invention, as shown in FIG. 3, includes an electron gun [1C] comprised of a ring shaped cathode [2C] with a resulting disc shaped electron beam generated plasma. As in the other embodiments, the electron gun includes a water inlet/outlet, water pool cooling system [4C] and a shield [3C] to confine electron emission to a limited region of the cathode surface [6C]. The shield is such that a planar sheet of electrons [5], as shown in FIG. 2, accelerates through the cathode dark space [7], also as shown in FIG. 2, and travels parallel to a heated substrate [9C]. In all other ways this embodiment is the same as the first and second embodiments except for the geometry.

Figure 4:
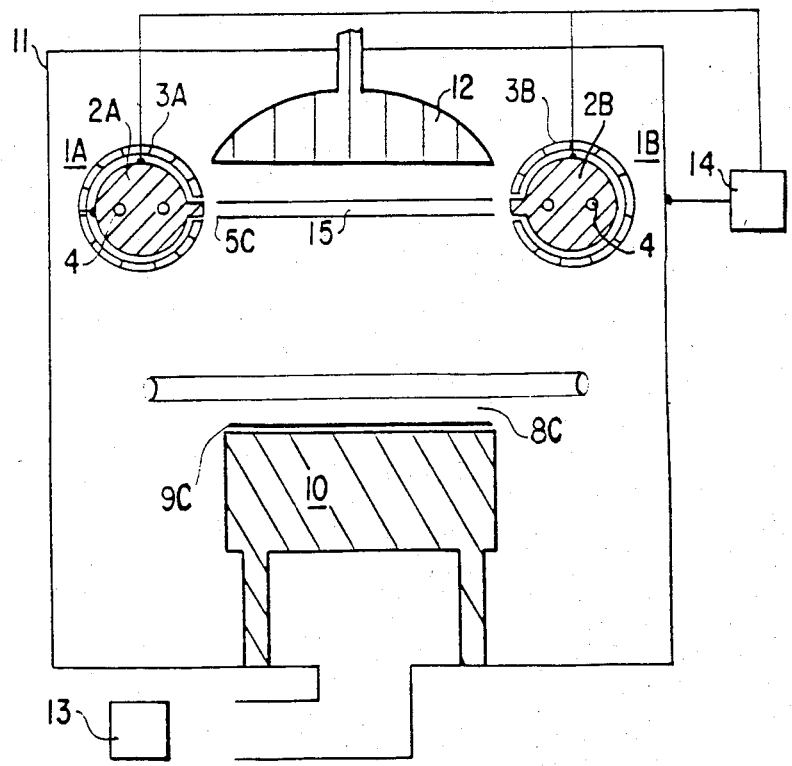
FIG. 4 is a diagrammatic sketch illustrative of the fourth embodiment of our invention which incorporates an electron beam created VUV lamp.

The fourth embodiment of the invention, shown in FIG. 4, substantially similar to the guns of FIG. 2, emphasizes rare gas sensitized dissociation and photolytic dissociation of gaseous film donor molecules and minimizes electron impact dissociation. Rare gas sensitized dissociation occurs in our embodiments when a rare gas resonantly absorbs the UV or vacuum UV radiation produced by fluorescence from electron beam excited rare gas atoms. The generation region or lamp is removed from the reaction zone in this way. The photoexcited atom may transfer its energy to donor molecules during collisions between the two species. This sensitized collisional dissociation and excitation does not require any absorption of light by the donor molecules and is highly efficient. It occurs in combination with electron impact dissociation/excitation, photolytic dissociation/absorption, or alone. The vacuum ultraviolet radiation is produced in a region [15], by the high energy electron beam [5C] exciting the resonance levels of a rare gas such as helium or argon. Photons, given off by the excited atoms, propagate to a reaction volume [8C] containing film donor gas molecules introduced into gas vessel [11] by a separate gas feed outfit [12A]. These same VUV photons are absorbed by rare gas atoms, outside the confined plasma region, causing rare gas sensitized reactions to occur. The VUV photons dissociate the donor molecules either directly or by sensitized reactions which then, as in the other embodiments, diffuse to a substrate [9C] and form a film. Thus, the electron beam volume [15] does not contact the reactant gas volume [8C] thereby reducing substrate radiation damage due to electron bombardment is. Consequently, in this fourth embodiment, VUV photons are the main cause of the film reactions whether by direct photodissociation or via sensitized reactions. This embodiment is diagrammatically depicted in FIG. 4. An important feature in this embodiment is the electron beam colliding with the rare gas atoms remotely from the substrate. Thus, a VUV source is provided in a region [15] within the deposition chamber itself and consequently, a window is not needed between the VUV lamp and the deposition chamber. This in-situ VUV lamp, without windows, is an important feature of our invention, since it avoids the problem of requiring a deep VUV window and reduces substrate radiation damage from both electrons and ions. All cathode configurations, single, FIG. 1, multiple pairs, FIG. 2 [2A, 2B] and a ring, FIG. 3 [2C], are used to excite the rare gas and indirectly dissociate film donor gas molecules photolytically or via sensitized reactions, as stated in this specification. The key factor determining the relative amounts of electron dissociation and photon dissociation is whether or not the confined electron plasma comes in direct contact with reactant gases as they are introduced into the reaction chamber. All the embodiments of the invention can be operated in either a d.c. or pulsed manner. The reactant gas flow can also be pulsed.

What we claim and desire to secure by Letters Patent is:

1. A chemical vapor deposition and native film growth apparatus for depositing or growing films on a substrate, the apparatus comprising:
    a reaction chamber;
    means for supporting the substrate within the reaction chamber;
    means for controlling the temperature of the substrate supported within the reaction chamber;
    means for introducing one or more selected gases into the reaction chamber;
    a glow discharge, cold cathode electron gun for producing a beam of high energy electrons, said glow discharge, cold cathode electron gun being positioned within the reaction chamber for exciting, ionizing, and dissociating molecules of the one or more gases introduced into the reaction chamber in a region therein defined by the beam of high energy electrons;
    vacuum pump means for evacuating the reaction chamber and for causing the one or more gases introduced into the reaction chamber to flow through the reaction chamber;
    gas flow control means for controlling the flow and pressure of the one or more gases introduced into the reaction chamber such that the gas pressure in the reaction chamber is maintained within the range of 0.05 Torr to 5 Torr; and
    power supply means for providing a source of negative high voltage to the glow discharge, cold cathode electron gun to start and maintain the production of the beam of high energy electrons therefrom.

2. A chemical vapor deposition and native film growth apparatus as in claim 1 wherein the reaction chamber is connected to a source of ground potential.

3. A chemical vapor deposition and native film growth apparatus as in claim 1 wherein one of the one or more gases introduced into the reaction chamber comprises a rare gas and wherein the beam of high energy electrons dissociates film donor molecules by absorption of vacuum ultraviolet radiation generated in the reaction as the result of interaction between the electrons and atoms of the rare gas.

4. A chemical vapor deposition and native film growth apparatus as in claim 1 wherein the glow discharge, cold cathode electron gun includes a cathode comprising a material having a high secondary electron emission coefficient by ion bombardment and a low sputtering yield.

5. A chemical vapor deposition and native film growth apparatus as in claim 4 wherein the material comprises aluminum covered with a thin oxide layer.

6. A chemical vapor deposition and native film growth apparatus as in claim 4 wherein the material comprises magnesium covered with a thin oxide layer.

7. A chemical vapor deposition and native film growth apparatus as in claim 4 wherein the material comprises doped silicon covered with a thin oxide layer.

8. A chemical vapor deposition and native film growth apparatus as in claim 4 wherein the material comprises doped germanium covered with a thin oxide layer.

9. A chemical vapor deposition and native film growth apparatus as in claim 4 wherein the material comprises a sintered mixture of a metal and an oxide.

10. A chemical vapor deposition and native film growth apparatus as in claim 9 wherein the metal comprises molybdenum.

11. A chemical vapor deposition and native film growth apparatus as in claim 9 wherein the metal comprises tungsten.

12. A chemical vapor deposition and native film growth apparatus as in claim 9 wherein the metal comprises tantalum.

13. A chemical vapor deposition and native film growth apparatus as in claim 9 wherein the metal comprises aluminum.

14. A chemical vapor deposition and native film growth apparatus as in claim 9 wherein the oxide comprises aluminum oxide.

15. A chemical vapor deposition and native film growth apparatus as in claim 9 wherein the oxide comprises magnesium oxide.

16. A chemical vapor deposition and native film growth apparatus as in claim 9 wherein the oxide comprises silicon dioxide.

17. A chemical vapor deposition and native film growth apparatus as in claim 4 wherein the material comprises a sintered mixture of a metal and a nitride.

18. A chemical vapor deposition and native film growth apparatus as in claim 17 wherein the nitride comprises aluminum nitride.

19. A chemical vapor deposition and native film growth apparatus as in claim 17 wherein the nitride comprises magnesium nitride.

20. A chemical vapor deposition and native film growth apparatus as in claim 17 wherein the nitride comprises silicon nitride.

21. A chemical vapor deposition and native film growth apparatus as in claim 4 further comprising shield means surrounding the cathode except for a selected electron emitting surface thereof to confine emission of the beam of high energy electrons to the selected electron emitting surface.

22. A chemical vapor deposition and native film growth apparatus as in claim 1 further comprising one or more additional glow discharge, cold cathode electrons guns positioned within the reaction chamber for producing a planar sheet of high energy electrons parallel to a surface of the substrate upon which it is desired to deposit or grow a film.

23. A chemical vapor deposition and native film growth apparatus as in claim 1 wherein the glow discharge, cold cathode electron gun includes a cathode shaped in the form of a ring and adapted to produce a disc-like sheet of high energy electrons parallel to a surface of the substrate upon which it is desired to deposit or grow a film.

24. A chemical vapor deposition and native film growth apparatus as in claim 4 wherein one of the one or more selected gases is a film donor gas that is introduced into the reaction chamber in close proximity to the substrate and wherein another one of the one or more selected gases is a buffer gas that is introduced into the reaction chamber in close proximity to an electron emitting surface of the cathode of said glow discharge, cold cathode electron gun and whereby the electron beam is operative for exciting molecules of the buffer gas to produce ultraviolet and vacuum ultraviolet photons to dissociate molecules of the film donor gas in a region that is in close proximity to the substrate.

25. A chemical vapor deposition and native film growth apparatus as in claim 1 wherein the source of negative high voltage provided by the power supply means is pulsed.

* * * * *